(12) United States Patent
Brucke et al.

(10) Patent No.: US 7,330,053 B2
(45) Date of Patent: Feb. 12, 2008

(54) PRESTAGE FOR AN OFF-CHIP DRIVER (OCD)

(75) Inventors: Paul Brucke, Munich (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 128 days.

(21) Appl. No.: 11/244,856

(22) Filed: Oct. 6, 2005

(65) Prior Publication Data

US 2006/0076979 A1    Apr. 13, 2006

(30) Foreign Application Priority Data

Oct. 8, 2004    (DE) .................. 10 2004 049 194

(51) Int. Cl.
*H03K 19/094* (2006.01)
(52) U.S. Cl. .................. 326/83; 326/86; 326/87; 327/108
(58) Field of Classification Search .......... 327/530, 327/108; 326/83, 86, 63, 68
See application file for complete search history.

(56) References Cited

U.S. PATENT DOCUMENTS 5,557,221 A * 9/1996 Taguchi et al. ............ 327/53
5,640,122 A * 6/1997 McClure .................... 327/530
6,177,817 B1 * 1/2001 Fifield et al. ............... 327/108

FOREIGN PATENT DOCUMENTS

| EP | 1 217 744 A1 | 6/2002 |
| EP | 1 372 265 A1 | 12/2003 |
| WO | WO 97/09784 | 3/1997 |
| WO | WO 01/54278 A1 | 7/2001 |

* cited by examiner

*Primary Examiner*—Vibol Tan
(74) *Attorney, Agent, or Firm*—Slater & Matsil, L.L.P.

(57) ABSTRACT

A prestage for generating a control signal for an output driver of an integrated circuit, wherein the integrated circuit can be provided with a reference potential and a supply potential fixed in relation to the reference potential, comprises an input for receiving an input signal from the integrated circuit, a circuitry for generating an output signal based on the received input signal, an output for outputting the generated output signals as control signal for an output driver as well as a current source, which is effectively connected to the circuitry. Thereby, the circuitry for generating an output signal and the current source are connected in series and connected to a first potential and a second potential such that a prestage potential difference across the series circuit is higher than a supply potential difference between the supply potential and the reference potential. Such a prestage has the advantage that it is less sensitive against variations on the reference potential or the reference potential, respectively, than conventional circuitries and can generate an output signal with well defined rise times.

11 Claims, 3 Drawing Sheets

PRESTAGE FOR AN OFF-CHIP DRIVER (OCD)

This application claims priority from German Patent Application No. 10 2004 049 194.1, which was filed on Oct. 8, 2004 and is incorporated herein by reference in its entirety.

TECHNICAL FIELD

The present invention relates generally to a prestage of an off-chip driver (OCD) of an integrated circuit, particularly to a prestage of an off-chip driver (OCD) for a CMOS memory device (DRAM) with high data rate.

BACKGROUND

In memory devices, such as dynamic memory devices with read and write access (DRAM), the communication of the memory to the external world is performed with the help of receivers and off-chip drivers (off chip drivers=OCD). The receivers receive the data during the write process, while the off-chip drivers (OCDs) provide the read data to the outside world. With the current strongly increasing data rates, the performance of the off-chip driver (OCD) is increasingly important. Thus, the length of a valid read date in a memory device according to the DDR II (double data rate II) standard, which is driven with a clock frequency of 533 MHz, is less than 940 ps (picoseconds). This corresponds to half a clock period. In this context, this is also referred to as the length of the so-called data eye.

The data eye can be corrupted by several undesirable mechanisms. Here, the mutual interference of simultaneously output read data has to be mentioned in particular. A memory device according to the DDR II standard can output up to 16 data bits simultaneously at the 16 data outputs, depending on the organization. If, for example, all data have the same switching direction, i.e. a low high transition, this results in decelerated switch edges through on-chip voltage drops on the on-chip supply voltage lines. Thereby, the useable data eye is reduced.

An off-chip driver (OCD) consists typically of a circuitry, which is referred to as output driver, a prestage and other circuit parts. The output driver can be constructed in a very simple way. In a simple embodiment, it basically consists only of pMOS field-effect transistors, which pull the output to a positive potential (pull up function) and of nMOS field-effect transistors, which pull the output to a low potential (pull down function). The pMOS and nMOS field-effect transistors are basically connected like in an inverter, however, the gate terminals are controlled by separate prestages for increasing flexibility.

In a circuit variation of an off-chip driver (OCD), control of the gate terminals of the prestage transistors is performed by using current sources. In contrary to a voltage control, this circuit variation has the advantage that the steepness of the switch edges is well controlled at an intermediate node between the prestage and the output driver, which means at the gate terminals of the output transistors. This increases the precision of the edge steepness at the output of the off-chip driver and thus contributes to an insensitivity of the data eye against interferences. In this circuit variation, charging of the gate capacitance of the output transistors is controlled by a current source. With fixed gate capacitance, a well defined increase of the gate source voltage at the output transistor results. As a result, the transistor is switched on in a well controlled manner and the edge of the data eye has a predetermined slope. Switching on a pMOS field-effect transistor in the output stage of the off-chip driver is performed with the aid of a nMOS field-effect transistor connected as current source. This reduces the gate potential of the pMOS field-effect transistor. Switching on an nMOS field-effect transistor in the output stage of the off-chip driver is performed by a pMOS field-effect transistor connected as current source. This increases the gate potential of the nMOS field-effect transistor whereby the nMOS field-effect transistor is switched on.

Figure 3:
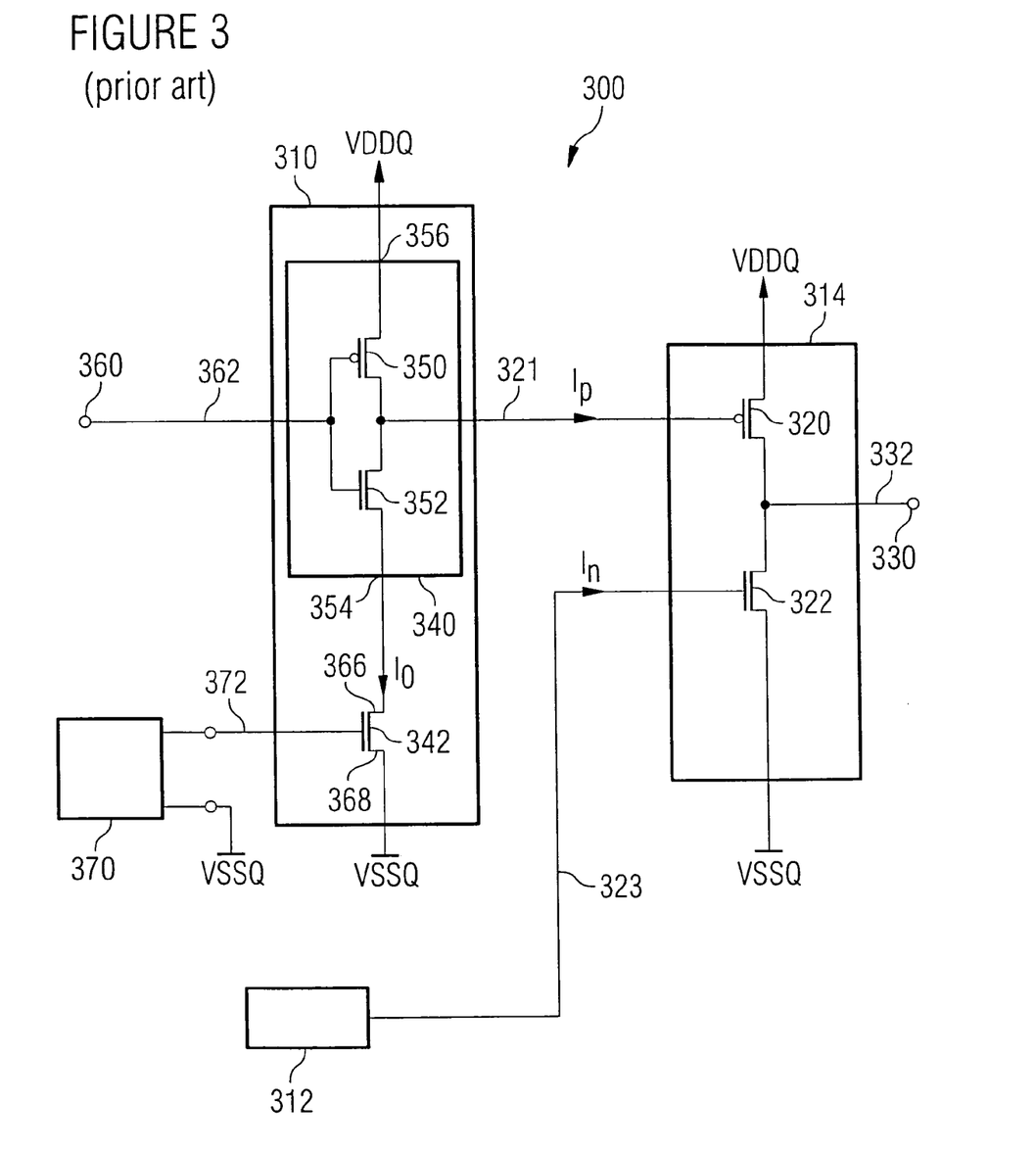
FIG. 3 is a portion of a circuit diagram of an off-chip driver according to the prior art.

FIG. 3 shows a detail of a circuit diagram of an off-chip driver according to the prior art. The off-chip driver is designated with 300 in its entirety. The off-chip driver 300 comprises a p prestage 310, a n prestage 312 as well as an output driver 314. The output driver 314 comprises a pMOS field-effect transistor 320 as well as an nMOS field-effect transistor 322. The pMOS field-effect transistor 320 and the nMOS field-effect transistor 322 are connected in a similar way as an inverter, wherein the gate terminal of the pMOS field-effect transistor 320 is controlled by the p prestage 310 with a p prestage output signal 321, and the gate terminal of the nMOS field-effect transistor 322 is controlled by the n prestage 312 with an n prestage output signal 323. The source terminal of the nMOS field-effect transistor 322 is connected to a reference potential VSSQ. The source terminal of the pMOS field-effect transistor 320 is connected to a supply potential VDDQ, which is positive relative to the reference potential VSSQ. As in an inverter, the drain terminals of the pMOS field-effect transistor 320 and the nMOS field-effect transistor 322 are connected to each other and to an output terminal 320, to which thus an output stage output signal 332 is applied.

The p prestage 310 comprises a CMOS inverter 340 as well as another nMOS field-effect transistor 342. As usual, the CMOS inverter 340 consists of a pMOS field-effect transistor 350 as well as an nMOS field-effect transistor 352 and has a first supply voltage terminal 354 as well as a second supply voltage terminal 356. The gate terminals of the two field-effect transistors 350, 352 are both connected to a data input 360, where a prestage input signal 362 is applied. The output of the CMOS inverter 340 controls the pMOS field-effect transistor 320 of the output driver 314. The source terminal of the pMOS field-effect transistor 350 is connected to the positive supply potential VDDQ. The source terminal of the nMOS field-effect transistor 352 is connected to the drain terminal of the nMOS field-effect transistor 342, which serves as current source transistor. Thus, the drain terminal of the transistor represents a current output 366. The source terminal of the current source transistor 342, which forms a base terminal 368, is connected to the reference potential VSSQ. The gate terminal of the current source transistor 342 is connected to a current source control circuit 370 and receives a current source control signal 372.

The n prestage 312 is structured complementary to the p prestage 310.

Based on the structural description, the mode of operation of the off-chip driver 300 will be described below. The output driver 314 switches the external output 330 to a high or low logic level, in dependence on the control signals of the p prestage 310 and the n prestage 312. The output of the pMOS field-effect transistor 320 pulls the external output 330 to a level close to the supply potential VDDQ, when a low logic level is applied to the gate terminal of the pMOS field-effect transistor 320. The output of the nMOS field-effect transistor 322 pulls the external output 330 to a level close to the reference potential VSSQ, when a high logic level is applied to the gate terminal. It has to be considered that either the gate source potential of the nMOS field-effect transistor 322 and the pMOS field-effect transistor 320 determines the current which the respective field-effect transistor can supply. The gate source voltage of the prestage transistors 320, 322 can thus not change instantaneously. Rather, the gate capacitance has to be charge-reversed for each of the transistors to obtain a change of the current flow through the respective transistor. The rate, at which the gate capacitance of an output stage transistor 320, 322 can be charge-reversed is finally a measure for the steepness of the output signal at the external terminal 330. The charge-reverse time is determined by the amount of the respective gate capacitance as well as the available control current $I_p$, $I_n$. The gate capacitance is mainly determined by the dimensions of the transistor and the thickness of the gate oxide. The dimensions of the transistor are mainly determined by the required output current as well as by technological standards. In the same way, the thickness of the gate oxide can not simply be varied, since it is determined by the technological standards. Thus, it is desirable to be able to determine the gate current $I_p$, $I_n$ for the output stage transistors 320, 322. As has been explained above, a determination of the respective gate currents allows, a determination of the edge steepness of the external output signal at the external output 330.

Control of the gate current is performed by the prestages 310 or 312, respectively. In the following, the mode of operation of the p prestage 310 will be discussed, an analog description applies to the n prestage 312. The p prestage comprises a current source transistor 342, whose gate source voltage is determined by a current source control circuit 370. Thus, the drain current $I_D$ of the current source transistor 342 is a function of the drain source voltage applied to the current source transistor 342. During normal operation of the circuit, the current source transistor 342 knows mainly two states. In the one state, both the drain source voltage and the drain current $I_D$ becomes zero. In a second stage, the drain current $I_{D,0}$, assumes a fixed predetermined value $I_{D,0}$, which is mainly determined by the current source control circuit 370. The second state is assumed when the drain source voltage of the current source transistor 342 exceeds a predetermined threshold. Then, the output resistance of the current source transistor is very high. The inverter circuit 340 determines, in which of the two states the current source transistor 342 is. If a sufficiently high positive potential (in relation to the reference potential VSSQ) is applied to the input 360 of the inverter circuit, the nMOS field-effect transistor 352 becomes conductive. As long as the potential at the data input 360 is high enough to switch on the nMOS field-effect transistor 352 and to allow a current flow through the current source transistor 342, the current source transistor provides the drain current $I_{D,0}$, provided the nMOS field-effect transistor 352 is designed for the transmission of a sufficiently large current. The current flowing in this mode of operation charges the gate source capacitance of the pMOS output stage field-effect transistor 320. If the gate potential of the pMOS output stage field-effect transistor 320 drops, the current through the drain source path of the nMOS inverter field-effect transistor 352 and through the current source transistor 342 decreases also. Thus, a static equilibrium state is established.

Further, it has to be noted that two conditions have to be fulfilled that the current source transistor 342 can provide the current predetermined by the current source control switch 370 to the pMOS output stage field-effect transistor 320. On the one hand, the voltage dropping across the drain source paths of the current source transistor 342 and the nMOS inverter field-effect transistor 352 has to be large enough to operate the respective transistor in saturation. On the other hand, the gate source voltage of the nMOS inverter field-effect transistor 352 has to be sufficiently high above the threshold voltage. If the two conditions are not fulfilled at the same time, the gate electrode of the pMOS output stage field-effect transistor 320 will not be charge-reversed with the intended current $I_{D,0}$.

Particularly, three situations are possible where despite the presence of a high logic level at the data input 360 of the p prestage 310, the gate capacitance of the pMOS output stage field-effect transistor 320 is not charge-reversed with the intended current. This is inevitably the case when the gate electrode of the pMOS output stage field-effect transistor 320 is already at a very low potential. At such a time, the charge-reverse process is already substantially terminated. Thus, it is neither required nor desirable to charge-reverse the gate capacitance any further. Rather, a static state should be achieved. Thus, this case represents no interference effect.

However, it can happen that the control potential at the data input 360 of the p prestage 310 is not sufficiently high. In that case, the nMOS inverter field-effect transistor 352 does not gate fully, and the current source transistor 342 cannot provide the given current. Such a case can be present when possible interferences in previous stages of a circuitry avoid that the logic level at the data input 360 achieves its full intended value.

On the other hand, an intended current flow can not be achieved, even when the intended potential is applied to the data input 360, but the reference potential VSSQ at the source terminal of the current source transistor rises above the intended value. In that case, the nMOS inverter field-effect transistor 352 and the current source transistor 342 cannot gate fully and the pMOS output stage field-effect transistor 320 does not receive the required control current for obtaining a sufficiently steep-edged output signal at the external terminal 330 at its gate terminal. A rising reference potential VSSQ can be observed, when several adjacent off-chip drivers perform similar switching operations at the same time. Then, a high current flows across the reference potential lines for VSSQ. Unavoidable ohmic voltage drops, which can further be added by the effects of the inductivities caused by bond wires, lead to a significantly noticeable voltage drop. Thus, proper operation of the off-chip driver 300 is no longer ensured.

Further, it should be noted that when a logic level is applied to the data input 360 of the p prestage 310, a corresponding pMOS inverter field-effect transistor 350 becomes conductive. Then, the same discharges the gate capacitance of the pMOS output stage field-effect transistor 320. The corresponding rise time is not critical, since the nMOS output stage field-effect transistor 322, which is mainly responsible for the transition from a high potential to a low potential at the output 330 of the off-chip driver 300, is activated at the same time.

The above-described circuitry has the disadvantage that it can be interfered or shut-down by strong voltage drops on the on-chip supply lines. If the reference potential VSSQ rises extensively, the above-described current source can be shut down, since the corresponding base potential increases. Thereby, the corresponding gate source voltage drops, and the current source is "pinched off". A similar behavior results for a possibly existing n prestage 312, when the supply potential VDDQ drops excessively.

Thus, the described circuit according to the prior art does not operate reliably when the supply potential and the reference potential, respectively, are subject to strong variations. However, these variations are only hard to avoid when several off-chip drivers switch simultaneously. Thereby, the circuitry according to the prior art has a significant reliability risk. Thus, the usage in high volume products is to be considered as problematical or questionable.

SUMMARY OF THE INVENTION

It is an object of the present invention to provide a prestage for an off-chip driver of an integrated circuit, which allows the off-chip driver to be less susceptible to potential variations on the reference potential line or the supply voltage line, respectively.

A prestage for generating a control signal for an output driver of an integrated circuit, wherein the integrated circuit can be provided with a reference potential and a supply potential determined with regard to the reference potential, the prestage having: an input for receiving an input signal from the integrated circuit; a circuitry for generating an output signal based on the received input signal; an output for outputting the generated output as control signal for the output driver; and a current source, which is effectively connected to the circuitry, wherein the circuitry and the current source are connected in series and connected to a first potential and a second potential such that a preselector potential difference across the series circuit is higher than a supply potential difference between the supply potential and the reference potential.

It is a central idea of the present invention that a stable operation of an off-chip driver and particularly the associated driver prestage becomes possible when the available voltage budget determined by the potential difference across the series circuit of current source and prestage logic is as high as possible. A potential difference, which is increased in relation to previous circuits, where the reference potential and the supply potential determine the maximum potential difference for the driver prestage, which is divided among the drain source paths of the field-effect transistors within the circuit, allows that the field-effect transistors can be brought into a desirable saturation operating state more easily. The same is required to ensure proper operation of the field-effect transistors switched as current source. Current source transistors and switching transistors are the main components of a prestage circuit.

Variations of the supply potential or the reference potential, respectively, have no longer such a serious effect as in circuits according to the prior art, when the potential difference across the whole prestage circuit is higher than the potential difference between the supply potential and the reference potential. When a larger voltage budget is present, field-effect or bipolar transistors, respectively, contained in the current source circuit can be kept in a saturation operating range or an active range, respectively, even with short-time variations of a supply or reference potential, respectively. Thus, the current source transistors of the prestage are in an operating range wherein the output current is mainly independent of the load. Thus, it is ensured that the control current at the gate terminal of an output stage transistor always corresponds to the predetermined value, even when variations on the supply potential or the reference potential occur.

An inventive prestage in connection with an output driver has the advantage that variations on the supply potentials have no effect on the control current for the output stage transistors required for switching from one logical state to another. This has the significant advantage that the steepness of the edges of the output signal at the external terminal is always constant, independent of possible variations on the supply or reference potential, respectively. Thus, a predetermined edge steepness can also be ensured when several adjacent outputs change the output level simultaneously in the same way.

According to one embodiment, a level circuit can be upstream of the data input, which adapts the data signal levels to the altered potential difference. This is advantageous since the circuit input of the prestage also reacts less sensitive to level variations of the input signal. In that the potential difference across the prestage is higher all in all, it is easier to bring the respective switching transistors in an operating stage, where the current provided to the output driver is mainly determined by the current source and not by the switching transistors. Therefore, a characteristic of the prestage occurs, which is less susceptible to slight variations of the data levels.

Thus, it is a significant advantage of the inventive circuitry that it enables to use a current control for an output driver even when the potential difference between a supply potential and reference potential is low or subject to significant variations. Thus, the inventive circuitry significantly expands the field of application for current-controlled drivers ensuring a well defined rise time of the output signal In a preferred embodiment, the prestage comprises a circuitry for generating an output signal with a first supply voltage terminal and a second supply voltage terminal. The current source has a current output and a base terminal, wherein the current output is connected to the first supply terminal of the circuitry. Such an arrangement has the advantage that a constant supply current is supplied to the circuitry with appropriate dimensioning in one of the two possible switching states. When an output stage transistor is switched on, the circuitry merely has to pass the current provided by the current source onto the output stage transistor. The determination of the current value, however, is made by the current source circuit. If the transistors used in the circuitry are dimensioned such that a current switchable by the same is high in relation to the current provided by the current source, this has the advantage that the circuitry can be designed mostly independent of the required current or the required edge steepness, respectively, because exactly these parameters are determined by the current source circuit alone. Thus, a change of the current source circuit is sufficient to obtain an adaptation of the output driver to different specifications. In a conventional circuitry, however, the current is determined by the geometry of the transistors and is thus not open to subsequent change. Thus, a large advantage results in a circuitry where a separation of current source circuit and circuitry for generating the output signal is given.

In a further preferred embodiment, the base terminal of the current source is connected to the base potential, which is more negative than the reference potential, wherein the supply potential is more positive than the reference potential. Advantageously, the second supply terminal of the circuitry for generating an output signal is connected to the supply potential. Such a circuitry is advantageous, since a constant current is to be received by the output terminal of the prestage. This is, for example, required when the gate capacitance of the pMOS output stage field-effect transistor whose source terminal is connected to the supply potential is to be charged. Switching on of the respective transistor is critical during control of such an output stage part. Thus, it is uncritical that the positive supply potential of the circuitry for generating an output signal is equal to the supply potential. On the other hand, it is very advantageous that the base potential of the current source circuit in such an inventive embodiment is more negative than the reference potential. Thus, a sufficiently high voltage budget is available for the charge process impressing the output signal form of the gate capacitance of the output stage transistor, which extends from the gate potential of the output stage transistor down to the base potential of the current source. Since the voltage budget itself is enlarged, variations of the reference potential have no significant effect on the operation of the circuit and particularly on the edge steepness of the output signal.

Analogously, it is advantageous to connect the base terminal of the current source to a base potential, which is more positive than the supply potential, when it is required that the prestage supplies (i.e. delivers) a constant predetermined current at its output during switching. In such a case, it is effective to connect the second supply terminal of the circuitry to the reference potential for generating an output signal.

In a preferred embodiment of the present invention, the prestage comprises a charge pump for generating the base potential. Such an embodiment offers the advantage that no base potential that is more negative than the reference potential or more positive than the supply potential has to be provided to the prestage from the outside.

On the other hand, it is very advantageous when the prestage is designed to receive the base potential from an external base voltage source. In that case, the circuit complexity for realizing the prestage is very low. An existing prior art circuitry merely has to be changed by providing an additional trace for the base potential as well as terminal for the base potential. This allows again a simple implementation of an inventive prestage in an existing circuit design. Here, the base voltage source can be both outside an integrated circuitry as well as inside an integrated circuitry. Thus, both the supply of an external supply voltage and the generation in an integrated circuitry is possible. Here, the supply of an external base voltage has the advantage that the circuit complexity within the integrated circuit is low. Any base voltage can be provided, which is highly loadable with external provision and not subject to the variations of the reference potential. On the other hand, it is sometimes advantageous to generate the base potential within the integrated circuitry. This is particularly advantageous when it is not possible to provide an integrated circuitry with an additional terminal for supplying a base potential according to existing specifications or standards, respectively. The number of pins does not increase during generation of the base voltage on the integrated circuit which contributes to lowering the costs. Further, nowadays, it is to integrate charge pumps into integrated circuits possible with little effort. In many cases, the required charge pumps are even an integral part of an integrated circuit. In such a case, it is particularly advantageous to use a charge pump already existing in an integrated circuit also for supplying the current sources in the output driver.

It is particularly advantageous when the prestage is integrated on a chip with integrated circuitry. Such an arrangement provides low production costs as well as good signal quality. Driver prestage, output driver and the integrated circuitry are on a chip, so that no external connections between the same are required. Thus, the signal quality is not decreased. Potentials that are possibly present on the chip can possibly be used as base potential. Thus, the full integration of integrated circuitry and prestage, and, if necessary, also the full output driver, represents both economically and technically a very favorable embodiment.

In a further preferred embodiment of the present invention, the prestage comprises a current source control circuit, which is designed to apply a current source control signal to the current source. Here, a field-effect transistor or a bipolar transistor can serve as current source circuit. The selection of the respective transistor type is dependent on the desired characteristics of the current source circuit as well as the available technology. Preferably, the current source control circuit is coupled to the base potential of the current source. One such an embodiment offers the advantage that the current provided by current source, which is ideally equal to the control current for the output stage transistor, can be determined by a current source control circuit. A plurality of current source control circuits is known, so that the determination of a required current is easily possible. Particularly, it is also possible that the current source control circuit is set to a required value, either during operation or even during an adjustment process during production. So, the central characteristic of the prestage, namely the provided current, can be determined with little effort and adapted to the requirements. It is advantageous to couple the current source control circuit to the base potential of the current source, since the potential difference between the control terminal of the current source circuit and the base potential determines the current provided by the current source circuit in many cases. As a result, the current provided by the current source circuit is essentially independent of variations of the reference potential or the supply potential, respectively, and thus as a whole constant in good approximation.

In a preferred embodiment, the logic data value of the input signal of the prestage is determined by an input voltage of the input signal in relation to the reference potential, and the prestage is designed such that the output signal of the prestage assumes a current value determined by the current source at a time when the input signal changes the logic data value. Such an embodiment is advantageous since by controlling the output driver or an output stage transistor, respectively, with a current signal, a significantly more precise adjustment of the edge steepness can be achieved as would be possible with voltage control. As a result, the prestage serves mainly for converting a voltage signal into a current signal. Particularly, in a described prestage, the fixed dependence of the edge steepness of the output signal on the levels at the input of the prestage is removed. The current of the output signal of the prestage is determined by the current source, particularly at switching time, since at that time the external output signal needs to have a predetermined edge steepness. The edge steepness, however, is determined by the current of the output signal of the prestage. Thus, the inventive circuitry has the advantage that the edge steepness assumes a predetermined value exactly at this critical time, the switching time, and is independent of variations on the logic level of the integrated circuitry.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
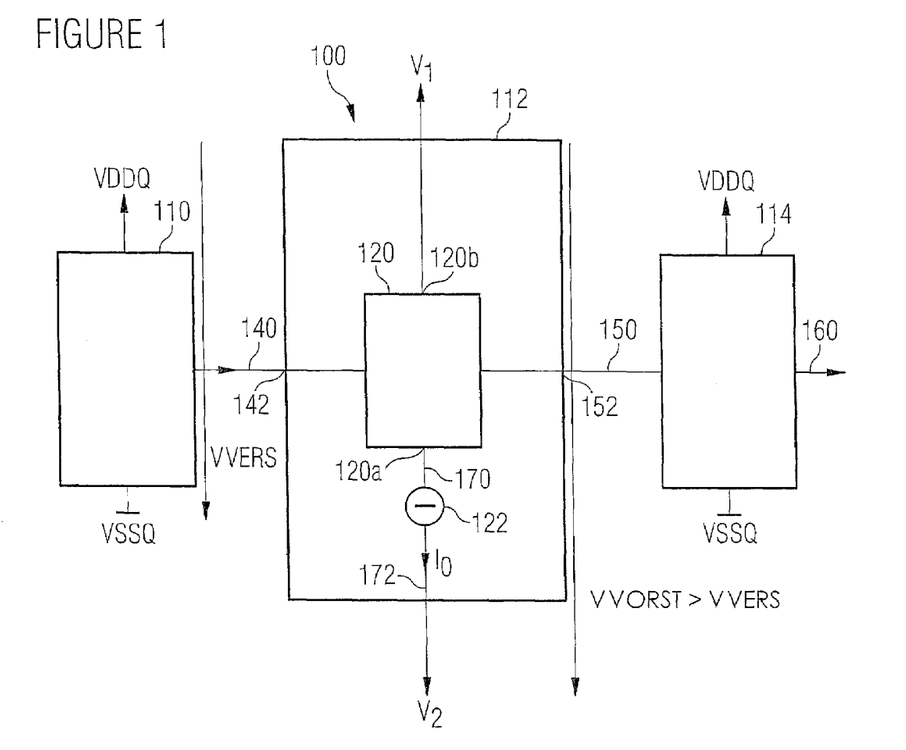
FIG. 1 is a block diagram of an inventive circuitry according to a first embodiment of the present invention.

FIG. 1 shows a block diagram of an inventive circuitry according to a first embodiment of the present invention. The circuitry is designated by 100 in its entirety. The circuitry comprises an integrated circuit 110, a prestage 112 as well as an output driver 114. The integrated circuit 110 is connected to a reference potential VSSQ as well as a positive supply potential VDDQ. The potential difference between the supply potential VDDQ and the reference potential VSSQ forms the supply voltage VVERS. The prestage 112 comprises a circuitry 120 for generating an output signal with a first supply voltage terminal 120a and a second supply voltage terminal 120b as well as current source 122 with a current source output 170 and a base terminal 172. The circuitry 120 as well as the current source 122 are connected in series between a first potential V1 and a second potential V2. The potential difference between the first potential V1 and the second potential V2 forms the prestage supply voltage VVORST. Further, the circuitry 100 comprises an output driver 114. The same is connected to the supply potential VDDQ and the reference potential VSSQ. The integrated circuit 110 provides an input signal 140 to the input 142 of the prestage 112, which is supplied to the circuitry 120. The circuitry 120 generates an output signal 150, which is applied to the output 152 of the prestage 112 and is supplied to the output driver 114. The output driver 114, on the other hand, generates an external output signal 160.

Starting from the description of the structure, in the following, the mode of operation of the present inventive circuitry will be described. The input signal 140 provided by the integrated circuit 110 is supplied to the circuitry 120 for generating an output signal. It is the object of the circuitry 120 to generate an output signal 150 based on the input signal 140, which can be used for controlling the output driver 114. Here, it is important to obtain precisely defined switch edges in the external output signal 160. For that purpose, the circuitry 120 for generating an output signal is supplied with electrical energy via a current source 122. The real current source has the characteristic that the provided current is not independent of the voltage arising across the current source, but rather becomes zero when the voltage arising across the current source is zero. Particularly, the current source can only provide a current when the potential at the current source output 170 is more positive than the potential V2 which is applied to the base potential of the current source. It is the object of the circuitry 120 for generating an output signal to pass the current of the current source 122 to the output 152 of the prestage as output signal 150, at a switching time when the logic value of the input signal 140 changes. In the present wiring, in that case, a current $I_0$ is received by the output 152 of the prestage. As a result, a voltage drop occurs across a circuit part of the circuitry 120, which is connected between current source output 170 and output 152 of the prestage, as well as voltage drop across the (real) current source 122 itself. Receiving the current $I_0$ is only possible when the potential difference between the output signal 150 and the second potential V2 is high enough to compensate the above-described voltage drops. Otherwise, only less current can be received at the output 152 of the prestage. In the present inventive circuitry, the second potential V2 is more negative than the reference potential VSSQ, which is used by the integrated circuit 110 as well as the output driver 114. Thus, it is ensured that the current source 122 and the circuitry 120 are operated in an operating point for generating an output signal, which allows an intended determination of the output current at the output 152 of the prestage. A second potential V2, which is lower than the reference potential VSSQ, is particularly advantageous when the reference potential VSSQ rises during the operation of the circuitry. This can, for example, be the case when several further output drivers or other circuit parts, which are all coupled to the reference potential VSSQ, are simultaneously switched such that a high current flow results on the associated reference potential line. In such a case, due to unavoidable ohmic drops, to which the effects of the inductivities caused by bond wires can be added, a voltage drop causing a rise of the reference potential VSSQ occurs within the circuitry.

In such a case, it can also happen in the inventive circuitry that the second potential V2, which is applied to the base terminal 172 of the current source, rises temporally, wherein it is ensured that the second potential V2 is always more negative than the reference potential VSSQ. Further, with an appropriate layout of the circuitry, the second potential V2 is chosen such that it is at any time low enough to allow an appropriate operation of the prestage, i.e. in the present embodiment the current consumption predetermined by the current source at the output 152 of the prestage. Here, the second potential V2 can be generated by any voltage source means, as long as it is ensured that the second potential V2 is more negative than the reference potential VSSQ.

Figure 2:
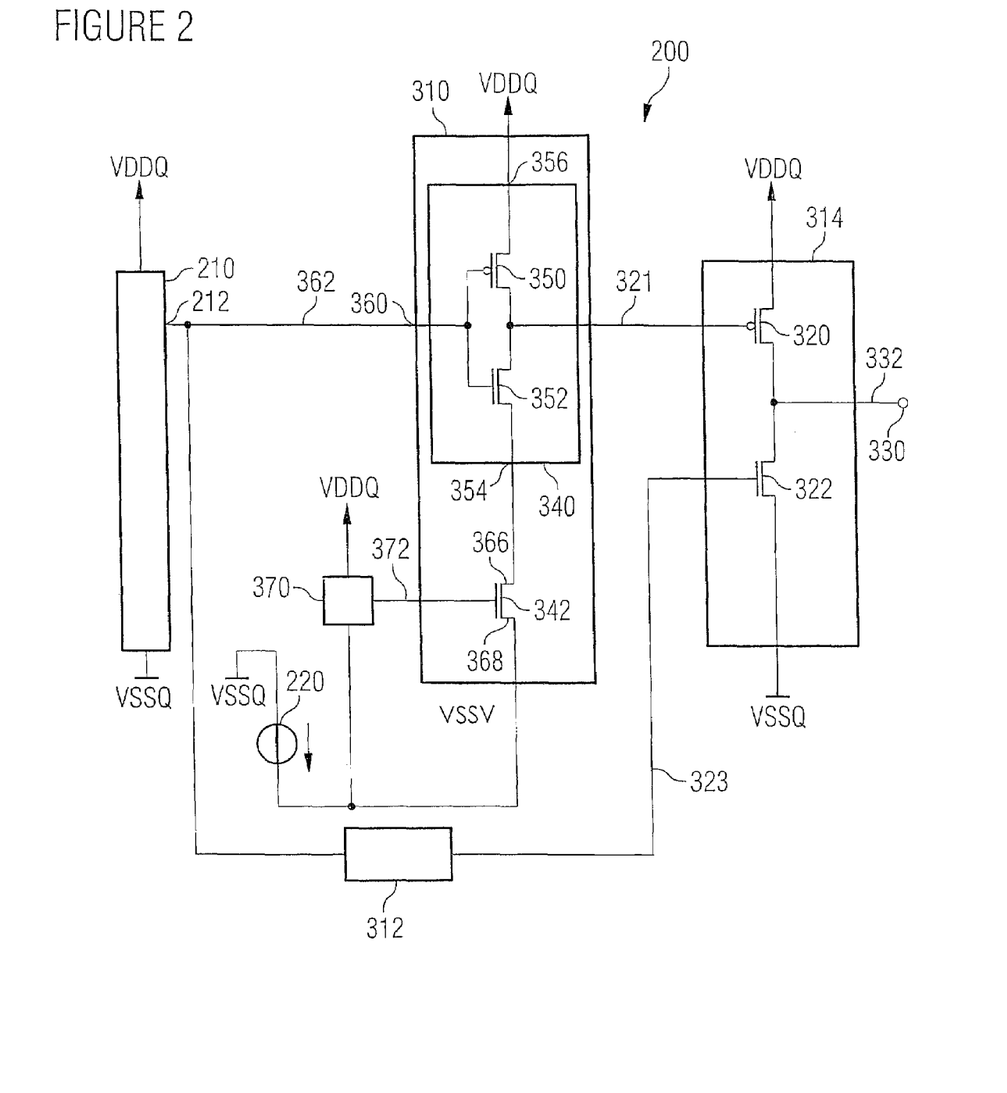
FIG. 2 is a portion of a circuit diagram of an inventive circuitry according to a second embodiment of the present invention.

FIG. 2 shows a portion of a circuit diagram of an inventive circuitry according to a second embodiment of the present invention. The circuitry is designated by 200 in its entirety. With regard to structure and mode of operation, the circuitry 200 corresponds mostly to the circuitry 300 according to the prior art described with regard to FIG. 3, so that unaltered parts are not described here. Rather, reference is made to the description of the circuitry 300. Otherwise, the same reference numbers in FIGS. 2 and 3 designate the same means.

It is the object of the illustrated circuitry to output a signal of an integrated circuit 210 at an external terminal 330. Apart from the means already described above, the circuitry 200 also has an integrated circuit 210, from whose output 212 the prestage input signal 362 is provided. Further, the source terminal of the current source transistor, which is also referred to as base terminal 368, is connected to a base potential VSSV, in contrary to conventional circuitries. The same is provided by a voltage source circuit 220, wherein the voltage source circuit 220 is designed such that during proper operation of the circuitry, the base potential VSSV is negative in relation to the reference potential VSSQ. The current source control circuit 370 is supplied by the supply potential VDDQ and is also coupled to the base potential VSSV.

Starting from the description of the structure, the mode of operation of the inventive circuitry 200 will be described in more detail below, as far as it differs from the mode of operation of a conventional circuitry 300. It is the object of the circuitry to receive a prestage input signal from an integrated circuit 210 and to generate an output stage output signal 332 based thereon, which is able to drive an external load connected to the external terminal 330. Here, the output stage output signal 332 is to show well defined rise times. Thus, the switching process from one logic level to another logic level is critical. In the preferred application of the output driver 314 it is required that the edge steepness of the output stage output signal 332 is well defined. As a result, overall, the switching-on process of the pMOS output stage field-effect transistor 320 or the nMOS output stage field-effect transistor 322, respectively, has to be well controlled. In order to switch on one of the transistors, the gate source potential determining the current flow through the channel of the respective transistor has to be changed. However, this cannot be performed instantaneously, since the output stage transistors 320, 322 have a gate capacitance that cannot be neglected. Controlled switching a particularly switching on of one of the two output stage transistors 320, 322 can be performed by charge-reversing the gate capacitance with an impressed current. Thus, the gate source voltage is mainly proportional to the charge on the gate and thus the integral across the gate current. If ideal conditions are assumed, a fixed predetermined gate current results with a change of the gate source voltage with a constant rate of change. Thus, the drain current, which is a function of the gate source voltage, changes also in a fixed way, which is described by a (typically nonlinear) connection between the gate source voltage and the drain current. It has turned out that impressing a constant gate current results in well defined rise times of the output signal. Thus, it is the object of the prestages to switch on the output stage transistor 320, 322 controlled by the prestage by impressing a constant gate current.

Thus, it is, for example, the object of the p prestage 310 to switch on the pMOS output stage field-effect transistor 320 in a controlled way, when a high logic level is to be output close to the supply potential VDDQ at an external terminal 330. Controlled switching-on of the pMOS output stage field-effect transistor 320 requires that the p prestage receives a constant current from the gate terminal of the pMOS output stage field-effect transistor 320 at the switching time and for a sufficiently long time after the switching time. In the switched-off state, the potential of the gate terminal of the pMOS output stage field-effect transistor 320 is at a high value close to the supply potential VDDQ, and has to be lowered at a fixed rate of change for switching on the transistor. This requires a constant current. It should be noted that the p preselector output signal has thus a high potential close to the supply potential VDDQ at the time when the pMOS output stage field-effect transistor 320 is to be switched on. This is significant for understanding the mode of operation of the circuit. Therefore, a transition of the prestage input signal 362 from a low logic level to a high logic level is considered.

If the preselector input signal 362 changes from a low logic level to a high logic level, this leads to the pMOS inverter field-effect transistor 350 being switched off. At the same time, a high potential is applied to the gate terminal of the nMOS inverter field-effect transistor 352. This allows a current flow through the nMOS inverter field-effect transistor 352, provided the source potential of the transistor 352 is clearly negative in relation to the gate potential, and the drain potential is clearly positive in relation to the source potential. However, a high drain potential is ensured, since it has been assumed that the gate terminal of the pMOS output stage field-effect transistor 320 is at a high potential close to VDDQ. If the drain potential of the current source transistor 342 is sufficiently negative in relation to the gate potential of the nMOS inverter field-effect transistor 352, an equilibrium state is established, such that a current flows through the drain source paths of the current source transistor 342 as well as the nMOS inverter field-effect transistor 352, which is essentially determined by the current source transistor 342 when the nMOS inverter field-effect transistor 352 is appropriately dimensioned. It is assumed that an appropriate potential is applied to the gate terminal of the current source transistor 342, which determines a fixed current value. Thus, the p prestage 310 receives current predetermined by the current source transistor 342 or the current source control circuit 370, respectively, whereby the gate source capacitance of the pMOS output stage field-effect transistor 320 is charged. Thereby, the gate potential of the corresponding output stage transistor 320 drops. As long as the potential difference across the drain source path of the current source transistor 342 is still sufficiently large as well as the gate source voltage of the nMOS inverter field-effect transistor 352 is sufficiently high, this current flow is maintained. If the drain potential of the nMOS inverter field-effect transistor 352 drops even more, this condition is no longer fulfilled. Thus, the current flow decreases continuously, until an equilibrium state is achieved, where the potential difference across the nMOS inverter field-effect transistor 352 and the current source transistor 342 is so small that no current can flow any longer. From this time, the gate potential of the pMOS output stage field-effect transistor 320 is constant.

For obtaining a well defined edge steepness, it is desirable that a well defined current flow can be kept up as long as possible. This is ensured in an inventive circuitry 200 by the fact that the source terminal of the current source transistor 342 is at a base potential VSSV, which is more negative than the reference potential VSSQ. If, however, a base potential VSSV were applied to the source terminal of the current source transistor 342, which is equal to the reference potential VSSQ, the current flow would normally decrease already shortly after switching time, i.e. at a time when the gate potential of the pMOS output stage field-effect transistor 320 is still very close to the supply potential VDDQ. In an inventive circuitry, the reduction of the current flow only occurs when the gate potential of the respective output stage transistor 320 is already sufficiently lower than the supply potential VDDQ. Thus, a lower base potential VSSV potentially increases the switching rate of the whole driver stage.

For a further understanding of the circuit, it has to be noted that several independent output drivers exist in a typical circuitry, which typically change their state at the same time. If very high current changes occur on the reference potential line VSSQ, the reference potential will change at the switching time due to ohmic drops on the reference potential lines, to which further the effects of inductivities caused by bond wires can be added. Particularly, it is common that the reference potential rises. If the base transistor 368 of the current source transistor 342, was directly connected to the reference potential, as it is usually the case (compare FIG. 3), only a very low voltage budget would be available across the current source transistor 342 as well as across the NMOS inverter field-effect transistor 352. Thus, a rise of the base potential would lead immediately to a current drop and thus a decelerated edge of the output stage output signal 332. By using a base potential VSSV at the source terminal of the current source transistor 342, which is lower than the reference potential VSSQ, it is ensured that even during a rise of the base potential VSSV, which can be accompanied by a rise of the reference potential VSSQ, a sufficient voltage budget is still provided across the two transistors 342 and 352. Thus, a sufficient current flow is ensured, which is substantially determined by the current source transistor 342 and the current source control circuit 370, respectively.

It should further be noted that it is practical to connect the current source control circuit 370 to the base potential VSSV. This is useful since the current flow through the drain source path of the current source transistor 342 is substantially determined by the gate source voltage, which is applied to the same. Thus, it is desirable to impress a fixed gate source voltage. This can be performed best when the current source control circuit is also connected to the base potential, i.e. the source potential of the current source transistor.

The voltage source circuit 220 can be realized in different forms. It is possible, to use, for example, a charge pump, which can be realized in CMOS technology relatively unproblematically and with little effort. The charge pump is preferably a charge pump which is provided on a chip of the integrated circuit anyway.

The current source control circuit 370 can also be modified within broad limits. Particularly, it is possible that the current source control circuit 370 comprises a means which enables setting of the current provided by the current source transistor 342. This can be required or desirable when technological variations are to be compensated. Also, setting of the current source current can be required to perform an adaptation of the edge steepness of the output stage output signal 330. Edges that are too steep can also result in increased liability to interference as well as in signal reflections. Thus, the edge steepness can be adapted to the external environment connected to the external terminal 330.

The n prestage 312 as well as the associated potential supply is constructed complementary to the p prestage 310, wherein the voltage sources and the current source control circuits are also complementary to each other. The source terminal of the associated current source transistor, which is now of the pMOS type, is connected to a positive base potential VDDV. The base potential VDDV is provided by a voltage source circuit such that it is positive in relation to the supply potential VDDQ. The current source control circuit 320 is supplied by the positive base potential VDDV, wherein the second supply potential terminal is connected to the reference potential VSSV. However, it is possible that current values or transistor dimensions, respectively, are changed in the n prestage 312 to compensate differences between pMOS field-effect transistors and nMOS field-effect transistors.

The present invention can be altered within broad limits without departing from the basic idea. Particularly, there is a large flexibility with regard to how the potential difference is generated, which drops across the prestages including the associated current source circuits. It is possible to use both potentials generated on-chip and potentials provided externally. It merely has to be ensured that the potential difference across the prestage (including the current source circuit) is higher than the potential difference between the supply potential and the reference potential, so that a parasitic drop in the supply network can be compensated. Preferably, a base potential of the prestage is chosen such that it is more negative than the reference potential of the integrated circuit by a certain amount, wherein the amount is defined by the parasitic drop to be compensated. External supply of a base potential for the current source is, for example, possible via an external terminal of a chip. An on-chip voltage source can also be used. This can, for example, be a charge pump or another embodiment of a DC/DC converter. Thus, there is a very high flexibility with regard to the used potentials. It is also possible that the integrated circuit and the output driver use different supply potentials. Then, it has to be ensured that the potential difference across the prestage (including current source circuit) is high enough so that the prestage can output a current defined by a current source circuit during a switching process, even when considering potential variations occurring at the supply potentials. This requires normally that the base potential of the current source is fixed such that it is outside the range between the supply potential and the reference potential of the other circuit parts. Further, it is possible that the current source circuit, which is realized by a current source transistor in the present embodiment, is modified. For example, a bipolar transistor can be used as current source. The same provides the advantage of a higher output resistance. Other realizations of a current source circuit can be used, even when they comprise more than one transistor. Thereby, it has to be merely ensured that the voltage budget is sufficient for the respective current source circuit in order to ensure that the current source circuit can output or receive, respectively, the determined current during the switching process.

Further, structural changes of the circuitry in the area of the prestage are possible, as long as it is ensured that the current provided by a current source is available at the output of the prestage during a switching process. It is possible to include additional passive devices, such as capacitors, inductors and resistors into the prestage or also into the output driver, respectively. These can be, for example, required or helpful to optimize the switching behavior. The addition of further transistor stages is possible as long as the principle switching mode of operation is maintained.

Thus, it is for example possible to connect a level circuit between the input of the prestage and the inverter circuitry. The level circuit can perform a level change in dependence on the supply potential and the base potential, whereby the circuit input of the prestage can have the same characteristic as in a conventional output circuit. Such a level circuit can also improve the interference immunity.

Further, it is possible to realize the above-described circuitry with bipolar transistors. The same are sometimes used in high speed circuits, for example, differential output signals are required. Bipolar transistors have a similar behavior in switching processes as field-effect transistors, but they differ in their operating point. With the present high-speed driver circuit, the transfer of the switching concept to bipolar transistors is no serious problem. The usage of a switching technology based on nMOS transistors is also possible. Junction field-effect transistors can also be used, such as are sometimes used in high speed circuits.

Thus, it has been shown that an inventive switching concept can be used in a very universal way. It is particularly advantageous for CMOS circuits, but not limited to the usage in those. If two prestages are used, an asymmetrical layout is possible. A p prestage and an n prestage can differ both with regard to the switching structure and with regard to the element parameters. Thereby, they can be adapted to respective requirements and characteristics of a p channel or an n channel field-effect transistor, respectively, of the output stage.

Finally, it is also possible to change the output driver. The inventive concept does not specify certain circuit technology. Particularly, the MOS field-effect transistors can be replaced by junction field-effect transistors. Even a usage of bipolar transistors is possible, when an appropriate operating point setting is used.

It is also possible to use only a single prestage for both transistors of the output driver. Such a combined prestage can, for example, comprise two current sources. Thus, a further simplification of the circuitry is possible without loosing the advantage of a controlled edge steepness. Thereby, it can be advantageous to provide two voltage sources at the same time, which generate an upper base potential, which is more positive than the supply potential, as well as a lower base potential, which is more negative than the reference potential. The prestage can then be operated between these two potentials.

Further, it is preferably possible that the external terminal is not only used as output but also as input. Thereby, a control circuit can be implemented in the prestage or in the output driver, respectively, which can switch the prestage or the output driver, respectively, into an inactive state. For example, it is possible to control the current sources correspondingly. On the other hand, further transistors can be used, which enable switching-off of a prestage or output driver, respectively, with appropriate control.

Finally, it has to be noted that the terminal designated here as external terminal can also be an on-chip connection. The indication "external terminal" merely indicates the presence of a link connecting several circuit blocks. Whether these circuit blocks are accommodated in separate housings or only represent different functional groups on a semiconductor chip, is insignificant. Particularly in high speed applications, it can be required to use an inventive driver even for links on a semiconductor chip.

Thus, it is possible that the whole circuitry including integrated circuit, prestage and output driver is accommodated on a single chip. The voltage source circuit and current source control circuit can also be implemented on the same semiconductor chip. This offers the advantage of a cost effective realization, where signals are not interfered by transitions from one chip to another. In the same way, the circuit components can also be distributed on several chips. Particularly, the prestage and/or the output driver can be accommodated on a separate chip, which is, for example, connected to the chip by bond wires, on which the actual integrated circuitry is formed. The usage of two or more packaged chips is also possible. A fully discrete layout of the inventive circuitry is also possible. Thus, the inventive switching concept has no technological limitations. The invention consists of the structure of the circuitry not its actual physical realization or the distribution of the circuit elements on one or several chips, respectively.

Memory devices are a particularly advantageous field of application for an inventive circuitry. Typically, they include negative voltages, which are generated by so-called charge pumps on the chip. If such a voltage is supplied to the off-chip drivers (OCDs) and is used as source voltage of the current source transistors for the pn FET transistors in output drivers, as well as eventually as supply voltage for the current source control circuit of the current source transistor, the circuit will become less sensitive against voltage variations, since the voltage budget of the current source rises. Even when the potential rises due to interferences, enough gate source voltage is present and the transistor does not leave the range where it functions as current source. A corresponding solution for the prestage of the off-chip drivers (OCD) in particularly for the n FET transistors of the output drivers is also possible. Here, positive voltages generated on the chip are used, which are higher than VDDQ.

Thus, the present invention provides a prestage for an off-chip driver, wherein the robustness of the off-chip drivers (OCD) against voltage variations on the supply lines is increased by using an on-chip negative voltage.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A prestage for generating a control signal for an output driver of an integrated circuit, wherein the integrated circuit can be provided with a reference potential and a supply potential determined in relation to the reference potential, the prestage comprising:
    an input for receiving an input signal from the integrated circuit;
    a circuitry for generating an output signal based on the received input signal;
    an output for outputting the generated output signal as a control signal for the output driver;
    a current source, which is effectively connected to the circuitry, wherein the circuitry and the current source are connected in series and connected to a first potential and a second potential such that a prestage potential difference across the series circuit is higher than a supply potential difference between the supply potential and the reference potential;
    wherein the circuitry comprises a first supply voltage terminal and a second supply voltage terminal, the current source comprises a current output and a base terminal, wherein the current output is coupled to the first supply voltage terminal, wherein the second potential is applied to the base terminal as base potential, and the first potential is applied to the second supply terminal.

2. The prestage according to claim 1, wherein the base potential is more negative than the reference potential, wherein the supply potential is more positive than the reference potential and the first potential is equal to the supply potential.

3. The prestage according to claim 1, wherein the base potential is more positive than the supply potential, wherein the supply potential is more positive than the reference potential and the first potential is equal to the reference potential.

4. The prestage according to claim 1 having a charge pump for generating the base potential.

5. The prestage according to claim 1 having a terminal to which the base potential can be applied.

6. The prestage according to claim 5, wherein the integrated circuitry comprises a voltage source circuit, which is designed to generate the base potential.

7. The prestage according to claim 1, wherein the circuitry is a basic CMOS circuit.

8. The prestage according to claim 1, wherein the prestage is integrated on a chip with the integrated circuit.

9. The prestage according to claim 1 having a current source circuit, which is designed to apply a current source control signal to the current source.

10. The prestage according to claim 9, wherein the current source circuit is coupled to the base potential of the current source.

11. The prestage according to claim 1, wherein a logic data value of the input signal is determined by an input voltage of the input signal in relation to the reference potential, and wherein the prestage is designed such that the output signal assumes a current value determined by the current source at a time when the input signal changes the logic data value.

* * * * *